(12) United States Patent
Nadeau-Dostie et al.

(10) Patent No.: US 7,139,946 B2
(45) Date of Patent: Nov. 21, 2006

(54) METHOD AND TEST CIRCUIT FOR TESTING MEMORY INTERNAL WRITE ENABLE

(75) Inventors: Benoit Nadeau-Dostie, Aylmer (CA);
Saman M. I. Adham, Kanata (CA)

(73) Assignee: LogicVision, Inc., San Jose, CA (US)

( * ) Notice: Subject to any disclaimer, the term of this patent is extended or adjusted under 35 U.S.C. 154(b) by 464 days.

(21) Appl. No.: 10/638,388

(22) Filed: Aug. 12, 2003

(65) Prior Publication Data

US 2004/0123203 A1 Jun. 24, 2004

Related U.S. Application Data

(60) Provisional application No. 60/433,987, filed on Dec. 18, 2002.

(51) Int. Cl.
*G11C 29/00* (2006.01)
*G11C 7/00* (2006.01)
(52) U.S. Cl. .................. 714/720; 714/719; 365/201
(58) Field of Classification Search ........ 714/718–720; 365/200–201
See application file for complete search history.

(56) References Cited

U.S. PATENT DOCUMENTS

| 4,326,290 | A | * | 4/1982 | Davis et al. ................. 714/718 |
| 4,680,760 | A | * | 7/1987 | Giles et al. .................. 714/718 |
| 4,969,148 | A | | 11/1990 | Nadeau-Dostie et al. |
| 5,222,066 | A | * | 6/1993 | Grula et al. ................. 714/718 |
| 5,241,501 | A | * | 8/1993 | Tanaka ........................ 365/201 |
| 5,764,952 | A | * | 6/1998 | Hill .............................. 716/4 |
| 5,968,192 | A | | 10/1999 | Kornachuk et al. |
| 6,044,481 | A | | 3/2000 | Kornachuk et al. |
| 6,360,342 | B1 | * | 3/2002 | Lee et al. .................... 714/718 |

OTHER PUBLICATIONS

SISO (Wayback Machine Archive: http://ourworld.compuserve.com/homepages/g_knott/elect339.htm, Published on Feb. 17, 2001).*

* cited by examiner

*Primary Examiner*—Guy Lamarre
*Assistant Examiner*—Steven D. Radosevich
(74) *Attorney, Agent, or Firm*—Eugene E. Prouix

(57) ABSTRACT

A method of testing write enable lines of random access memory having at least one word having one or more write enable inputs for controlling write operations in the word, comprises, for a selected memory address, shifting a series of test bits through an addressed word via a first data input to the word, and for each test bit, performing a write operation to the word using a write enable test input derived from data outputs of the word or from a test write enable signal applied concurrently to each write enable input; and, after each write operation, comparing a last bit of the word against an expected value to determine whether there exists a defect in a write enable line.

49 Claims, 8 Drawing Sheets

Fig. 6.
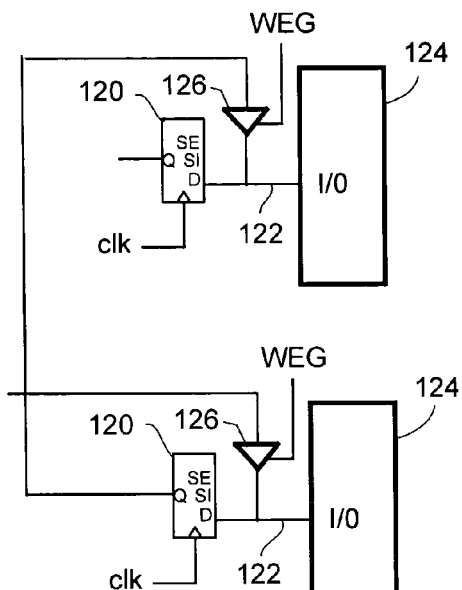
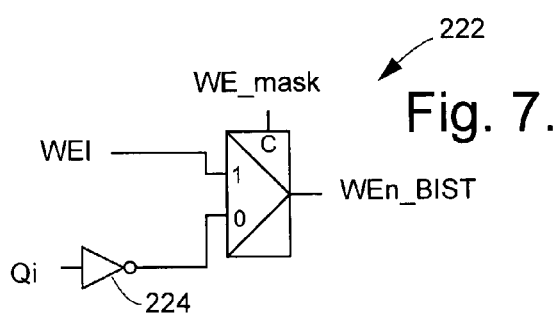
Fig. 7.
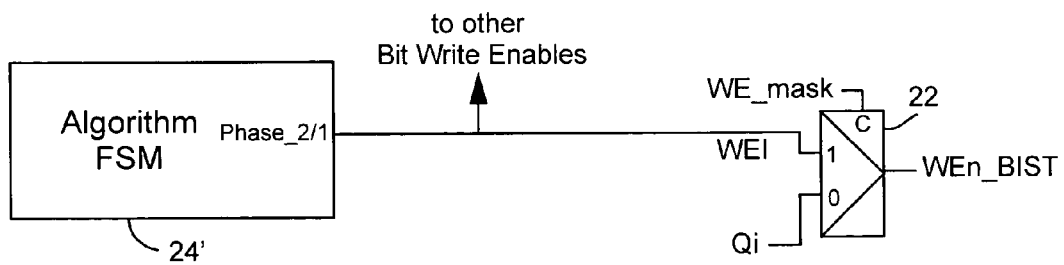
Fig. 8.

RIGHT SHIFT CONFIGURATION    LEFT SHIFT CONFIGURATION

METHOD AND TEST CIRCUIT FOR TESTING MEMORY INTERNAL WRITE ENABLE

CROSS-REFERENCE TO RELATED APPLICATIONS

This application claims the benefit of Provisional Application Ser. No. 60/433,987 filed Dec. 18, 2002.

BACKGROUND OF THE INVENTION

1. Field of the Invention

The present invention generally relates to testing of integrated circuits and, more specifically, relates to a method and test circuit for testing memory write enable inputs.

2. Description of Related Art

Nadeau-Dostie et al. U.S. Pat. No. 4,969,148 granted on Nov. 6, 1990 for "Serial testing technique for embedded memories", incorporated herein by reference, describes a testing circuit which interfaces serially with the data path of an embedded memory circuit formed from at least one memory unit having separated data input and output lines and tandem addressing. Part of the testing circuit is a series of two-input multiplexer units which are adapted to be embedded on the same chip as the memory circuit. The outputs of the multiplexer units connect to a respective one of the data input lines of the memory circuit. Except for the first bit position, a first input of each multiplexer unit connects to the data output line of the adjacent bit position in the memory circuit. The second input of the multiplexer units connects to the data bus of the chip. The testing circuit includes a finite state machine which connects to the first input of the multiplexer unit at the first bit position and to the data output line at the last bit position. During testing, the finite state machine actuates the multiplexer units to connect the first bits, and, for each address, outputs a series of test bits, shifts the bits through an addressed word by a series of read and write operations, and examines the bits after their passage through the addressed word for defects in the memory circuit at that address. The finite state machine may or may not be embedded on the same chip as the memory circuit.

Bit and byte write enables are commonly used in embedded memories. In addition, words may be arranged into groups of data bits having a different number of data bits than that of a byte. During execution of memory Built-In Self-Test (BIST) algorithms, these write enables are selectively connected to the memory global write enable and the test algorithm verifies that the write enables are not stuck inactive. During the execution of a scan or logic test, the write enables are typically tested for other faults, such as stuck active or shorted to other signals. The faults are tested up to the boundary of the memory itself. However, some of the same faults may originate from within the memory itself and, therefore, are not detected by test strategies heretofore employed.

There is a need for a method and a test circuit for detecting faults in bit and byte write enables that originate from within a memory.

SUMMARY OF THE INVENTION

The present invention seeks to provide a method and test circuit for detecting defects in bit, byte and group write enable connections that are internal to a memory. The heretofore undetected defects are defects such as stuck-at active or shorts between write enable signals.

The method generally involves shifting a series of test bits through an addressed word via a first data input to the word and, with each test bit, performing a write operation to the word using a write enable test input derived from either data outputs of the word or from a test write enable signal applied concurrently to each write enable input; and after each write operation, comparing a last bit of the word against an expected value to determine whether there exists a defect in a write enable line.

An embodiment of the present invention is generally defined as a method of testing group write enable lines of random access memory having a global write enable input for controlling write operations in the memory, at least one word arranged in one or more groups of memory cells, and having data inputs, data outputs and group write enable inputs for controlling group write operations in the groups, the method comprising, for a selected memory address: initializing a word under test to a predetermined value of the group write enables; serially connecting the data inputs and data outputs between a test serial input connected to the data input of a first bit of the word and a test serial output connected to a data output of a last bit of the word; shifting a series of test bits which are opposite the predetermined value through an addressed word by a series of read and write operations, with each write operation being performed using, for each group, a group write enable test input selected from either a group write enable mask derived from a last data output of the group or from an a test group write enable signal; and performing a final read operation.

Another aspect of the present invention is generally defined as a test circuit for testing group write enable lines of random access memory (RAM) having at least one word arranged in one or more groups of data bits, a global write enable input, data inputs, data outputs, and group write enable inputs for controlling write operations to the groups of data bits, comprising means for selectively connecting the data inputs and data outputs in series or in parallel, and, when connected in series, the data inputs and outputs defining a serial path between a test serial input connected to a first of the data inputs and a test serial output connected to a last of the data outputs; and means associated with each group write enable input for selectively connecting either a data output of the group or a test group write enable signal to the group write enable input.

BRIEF DESCRIPTION OF THE DRAWINGS

These and other features of the invention will become more apparent from the following description in which reference is made to the appended drawings in which:

FIG. 6 is a test circuit according to an embodiment of the present invention for use in testing a memory having bidirectional data input and output ports;

FIG. 7 illustrate a multiplexer circuit, which may be used to handle active 0 write enable signals;

FIG. 8 illustrates an arrangement, according to an embodiment of the present invention, which may be used to test for write enable stuck active for all combinations of data patterns;

DETAILED DESCRIPTION OF PREFERRED EMBODIMENTS

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

In the present description, the term "group" refers to a number of data bits or memory cells in a word of memory. The number of data bits in a group may be any positive integer number smaller than the number of bits in a word. The sum of the number of data bits in a group may the same as the number of bits in a word or in a byte. The number of groups may be any positive integer number less than or equal to the number of bits in a word. A word may be comprised of groups of different sizes.

The present invention provides a test circuit for testing group write enable lines of random access memory (RAM) having at least one word arranged in one or more groups of data bits, a global write enable input, data inputs, data outputs, and group write enable inputs for controlling write operations to the groups of data bits. The test circuit comprises means for selectively connecting the data inputs and data outputs in series or in parallel, and, when connected in series, the data inputs and outputs defining a serial path between a test serial input connected to a first of the data inputs and a test serial output connected to a last of the data outputs; and means associated with each group write enable input for selectively connecting either a data output of the group or a group write enable test signal to the group write enable input.

The following description illustrates two examples. In the first and simpler example (embodiments of FIG. 1 and FIG. 9), the number of data bits in a group is one. These embodiments are referred to as bit write enable testing. In the second example (embodiments of FIG. 5 and FIG. 10), the number of data bits in a group is three. These embodiments are referred to as group write enable testing.

Bit Write Enable Testing

Figure 1:
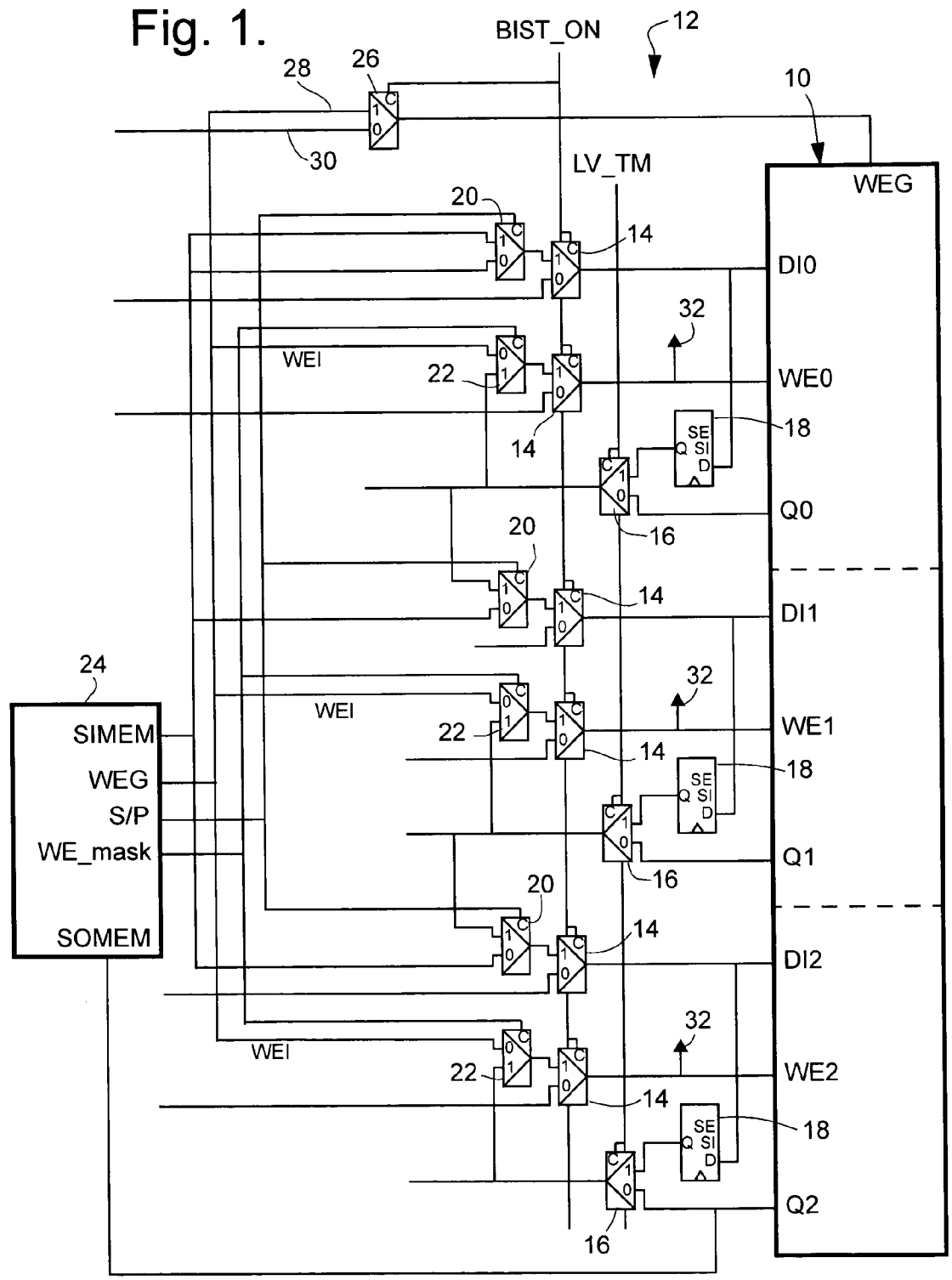
FIG. 1 is a circuit diagram which illustrates a memory interface having three data inputs, data outputs and write enable inputs, and a test collar according to an embodiment of the present invention.

FIG. 1 illustrates a memory boundary 10 having three data inputs DI0, DI1, DI2, corresponding data outputs Q0, Q1, and Q2 and bit write enable inputs WE0, WE1, WE2. These inputs and outputs are connected to three data bits or memory cells of the memory. The three cells together form a memory word. A global write enable input, WEG, controls write operations to the memory. The internal connections between the data inputs, data outputs, and write enable inputs and the memory cells have not been shown.

A test circuit 12, which includes a memory test collar and a test controller, provides a number of multiplexer units described below.

A multiplexer 14 is provided for each data input DIx and write enable input WEx, where x refers to a specific bit of the memory. Multiplexers 14 operate under control of a BIST_ON signal and select between a functional input and a test input. The BIST_ON signal is active during testing.

A multiplexer 16 is provided for each data output Qx and operates under control of a control signal LV_TM. Multiplexers 16 serve to connect either the data output Qx or the output of a memory element 18 to the input of a multiplexer 22. Multiplexers 16 select the output of memory element 18 during a logic test mode, but not during a memory test mode, to provide a known value to logic connected to the memory output.

A multiplexer 20 is provided for each data input. Multiplexers 20 are controlled by a control signal S/P and operate to connect data inputs and outputs in series (S) or in parallel (P). The two inputs of the multiplexer associated with the first data input receive a test serial input SIMEM. The first data input is connected to an output of a test controller 24 (as shown). The remaining multiplexers 20 select between an adjacent data output, in serial mode, and the test data input SIMEM, in parallel mode. Thus, the multiplexer 20 corresponding to input DI1 receives output Q0 at multiplexer input 1 and the test data input SIMEM at multiplexer input 0. Thus, multiplexer units 20 serve as means for selectively connecting the data inputs and data outputs in series or in parallel, and, when connected in series, the data inputs and outputs define a serial path between a test serial input connected to a first of the data inputs and a test serial output connected to a last of the data outputs.

A multiplexer 22 is provided for each bit write enable input WEx and serve as means associated with each group write enable input for selectively connecting either a data output of the group or a group write enable test signal to the group write enable input of the memory. More specifically, multiplexers 22 select between a test group write enable signal, WEi, and a write enable mask signal under control of a mask control signal, labeled WE_mask, which are output by memory test controller 24. WEi may be the same as the global write enable, WEG, or its inverse. Alternatively, it may be tied to the active value of WEG. The use of a value which is tied to the active value of group write enables is preferred in order to reduce loading on WEG and to improve performance of the test circuit. It will be noted that multiplexers 22 reside on the BIST side of the test collar to ensure no extra performance penalty. Memory test controller 24 includes a finite state machine (FSM), not shown, which includes states that implement the method of the present invention.

A two-input multiplexer 26 has an output connected to memory global write enable input, a first input 28 connected to test global write enable output WEG of controller 24, a second input 30 connected to a functional global write enable source (not shown) and a control input connected to the BIST_ON test control input. The test collar also includes various observation points 32 which are used during scan testing.

The memory test collar provides control of the bit (or group) write enables by using the memory data output as will now be explained.

Write Enable Defect Detection Method

The present invention provides a method for testing write enables which uses a serial mode of operation by serially marching patterns of 1s and 0s into a word, starting at memory address 0. These patterns verify any combination of shorted signals, not only "adjacent" combinations.

Figure 2:
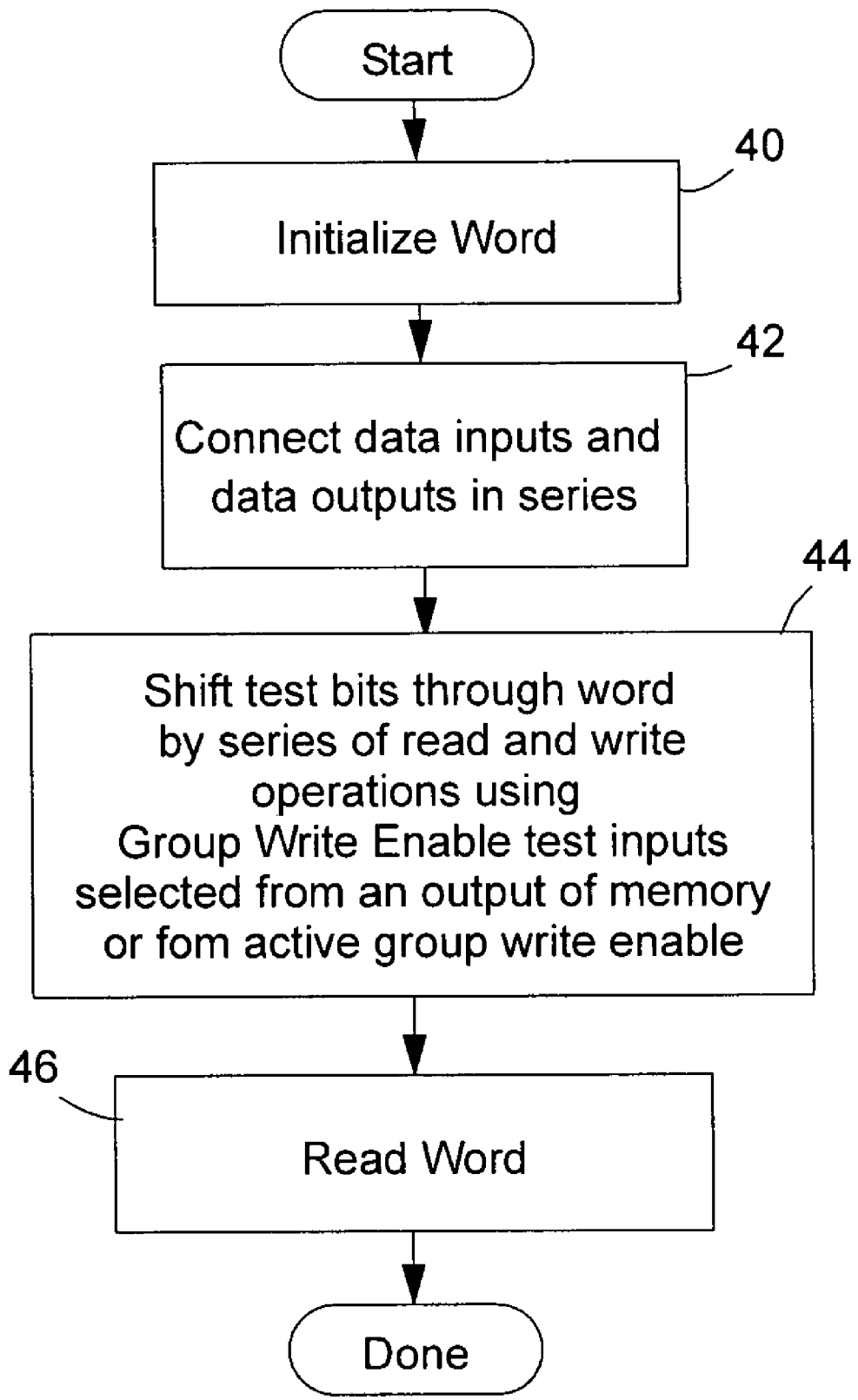
FIG. 2 is a flow diagram generally illustrating the write enable test method according to a preferred embodiment of the present invention.

More specifically, the present invention provides a method of testing group write enable lines of random access memory having a global write enable input for controlling write operations in said memory, at least one word arranged in one or more groups of memory cells, and having data inputs, data outputs and group write enable inputs for controlling group write operations in said groups. The method is generally illustrated in FIG. 2. As will be seen, the same method is used for bit write enable testing and group write enable testing. The method generally comprises, for a selected memory address, initializing a word under test to a predetermined value (step 40); serially connecting the data inputs and data outputs between a test serial input connected to the data input of a first bit of the word and a test serial output connected to a data output of a last bit of said word (step 42); shifting a series of test bits which are opposite the predetermined value through an addressed word by a series of read and write operations (step 44), with each write operation being performed using, for each group, a group write enable test input selected from either a group write enable mask derived from a last data output of the group or from a test group write enable signal; and then performing a final read operation (step 46).

Each read operation of the series of read and write operations comprises reading the word and comparing the last bit of the word to a first expected value. The final read operation comprises reading the word and comparing the last bit of the word to a second expected value opposite the first expected value. All write operations are performed with the global write enable signal set active.

As will be seen, the method may be repeated in a number of ways to achieve maximum coverage. For example, after performing the method using one predetermined initialization value, the method is repeated with the memory initialized to the opposite value. The method is initially performed by first shifting test bits in a first direction through the word between the test serial input and the test serial output. The method may then be repeated with test bits shifted in the opposite direction.

Preferably, the method is performed at each of two or more selected addresses of a memory under test. For example, the method is performed at at least one address in each column of a memory which has separate write drivers and associated logic for each column and at at least one address of each bank of a memory having multiples banks. For a memory having multiple banks and columns having separate write drivers and associated logic for each column, the method is performed at at least one address in each column of each bank.

When the predetermined value is an active value of the group write enables, each read and write operation of the series of read and write operations comprise a sequence of a read operation and a write operation using the write enable mask to write a test bit at the test serial input to the first memory cell of the word.

When the predetermined value is an inactive value of the group write enables, each read and write operation of the series of read and write operations includes a first sequence of a read operation and a write operation using the write enable mask and a second sequence of a read operation and a write operation using an active group write enable signal to write the test bit at the test serial input to the first memory cell of the word.

The memory may be initialized either serially or in parallel.

Step 42, the connection of the data inputs and data outputs in series, is achieved by applying an active signal to the S/P control input of multiplexers 20. The bit (or group) write enable test input is derived from the memory by connecting the last output of each bit (or group) to its respective bit (or group) write enable input by applying an active WE_mask signal to the control input of multiplexers 22.

In the preferred embodiment of the method, the method comprises two phases, which may be expressed as follows:

$$\text{Phase 1: } (R1W_m0)^{B*}(R0W0) \quad (1)$$

$$\text{Phase 2: } [(R0W_m1)(R0W1)]^{8*}(R1W1) \quad (2)$$

where:

B* indicates operations performed on all bits of the word under test, one bit at a time;

$W_m0$ or $W_m1$ indicate write operations using a bit or group write enable mask derived from an output of the memory. The 0 and 1 values indicate data written to the test serial input—a first bit of a word under test. The value written to all other bits in the word is determined by the data output of their respective adjacent bit;

R1 and R0 indicate read and compare operations. The read operation comprises reading the word under test. The compare operation compares the last bit of the word against an expected value to detect write enable defects; and W0 or W1 indicate write operations using the active value of bit or group write enables. Again, the 0 or 1 indicate the data applied to the test serial under, i.e., a first bit of the word.

Phase 1

Figure 3:
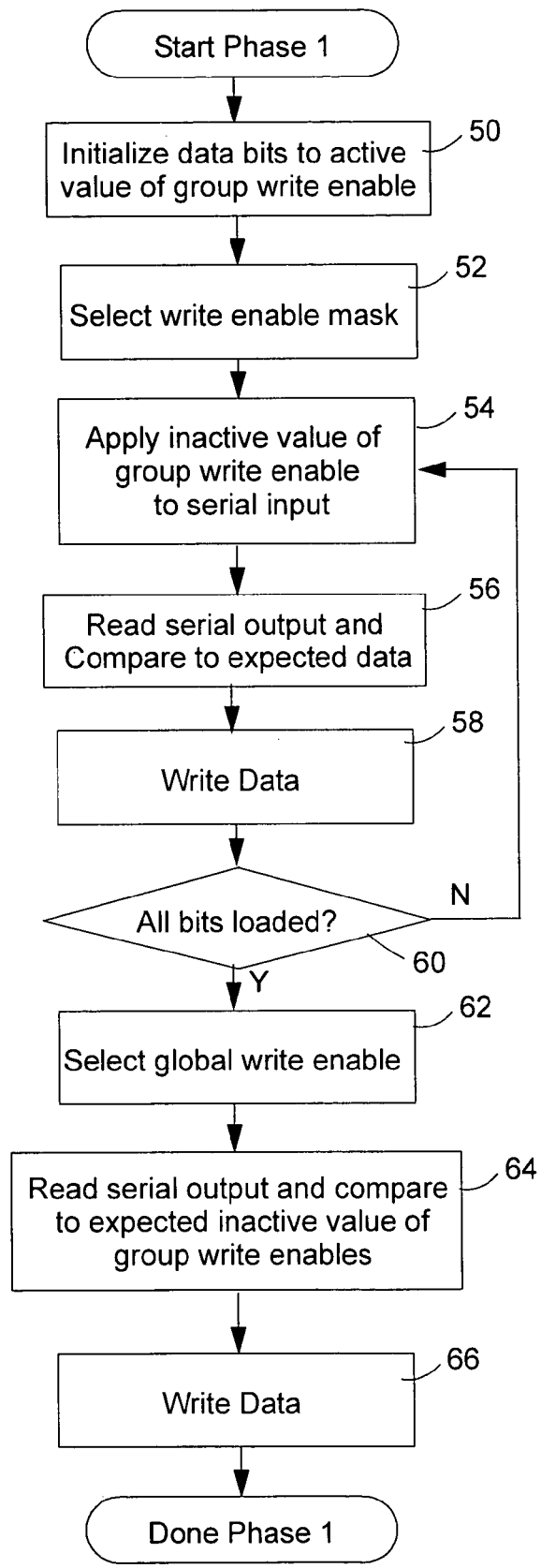
FIG. 3 is a flow diagram generally illustrating a first phase of write enable test method according to a preferred embodiment of the present invention.

The first phase of the method, illustrated in FIG. 3, tests for all combinations of wired-AND shorts between write enables (including bit and global enables). This phase uses a predetermined value which is an active value of the group write enables, the test bits are inactive values of the group write enables, a first expected value is the active value of the group write enables and a second expected value is an inactive value of the group write enables.

Referring to the flow chart of FIG. 3, the first step (step 50) is to initialize the portion of the memory associated with the write enables to be tested to the active value of the group write enables. This is followed by selecting the write enable mask (step 52) by applying an active value to the WE_mask control input of multiplexers 22. This causes each data output of each bit to be applied to its corresponding write enable input. Thus, as mentioned above, the bit write enable mask is read from the memory itself.

This is followed the shifting of a sequence of inactive values, one test bit at a time, of the bit write enables through the serially connected bits of the addressed word. As each test is loaded (step 54), the word is read and the last bit of the word is compared to an expected active value of the bit write enables (step 56) and then a write operation (step 58) is performed. The write operation is performed by applying an active global write enable signal to the global write enable input of the memory via multiplexer 26. The number of read/write operations corresponds to the number of bits of the selected. When these operations have been completed, determined at step 60, another read operation and compare (step 62) is performed. Optionally, a write operation is then performed by using the active value of the global write enable as the group write enable test input. This is achieved (step 64) by applying an inactive value to the WE_mask control input of multiplexers 22 which applies input WE1 (step 66) to the group write enable inputs.

TABLE 1 explicitly delineates each operation, the values loaded, group write enable values, memory contents and includes comments respecting each specific step. The first four rows in TABLE 1 relate to phase 1 as applied to the three bit memory of FIG. 1. As can be seen, this phase concludes with the memory word being populated with 0s, assuming no bit write enable faults exist.

Phase 2

Figure 4:
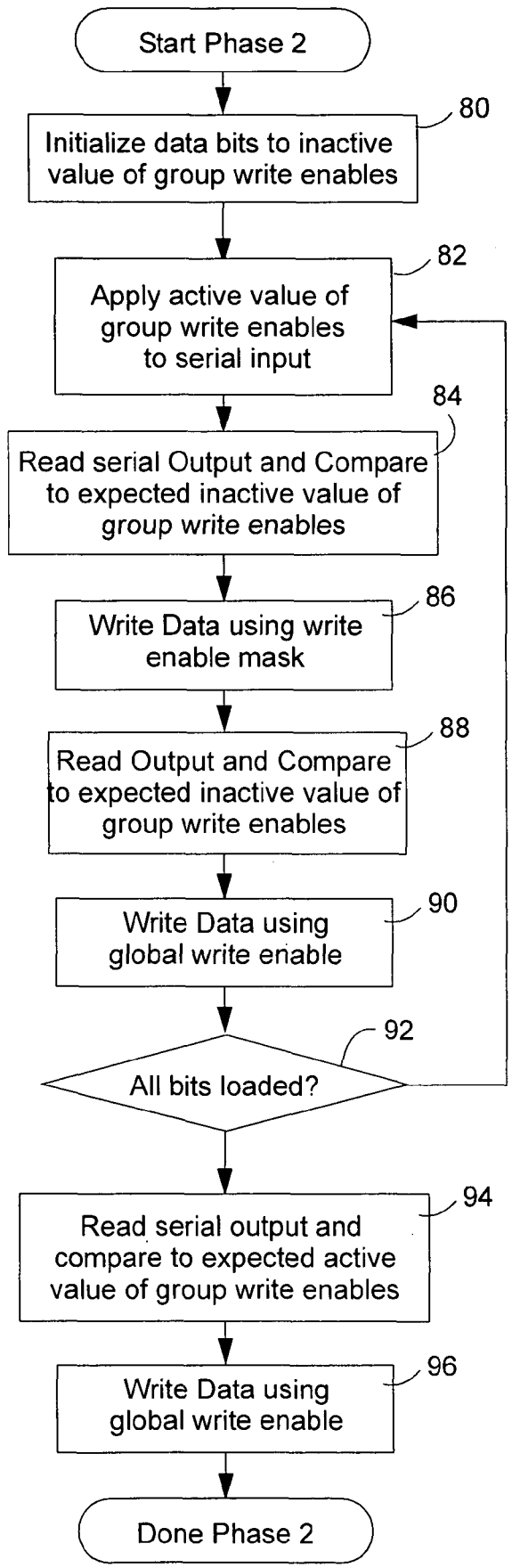
FIG. 4 is a flow diagram generally illustrating a second phase of the write enable test method according to a preferred embodiment of the present invention.

The second phase of the method, illustrated in the flow chart of FIG. 4, tests for all combinations of wired-OR shorts. The second phase generally involves repeating the method using a predetermined value which is an inactive value of said group write enables, test bits which are active values of said group write enables, a first expected value which is said inactive value of said group write enables and a second expected value is an active value of said group write enables.

Thus, referring to FIG. 4, the second phase starts by initializing the serially connected data bits to a predetermined value of the group write which is the inactive value of the bit (or group) write enables (step 80). This step is optional if phase 2 immediately follows phase 1 because, as indicated above, phase 1 results in the word being populated with inactive values of the group write enables. This is followed by shifting a series of test bits which are opposite the predetermined value, i.e., active values of the group write enables, through an addressed word by a series of read and write operations.

The inactive value of the bit write enable signal, logic 0 in this case, is applied to the test serial input (step 82) and then two read and write operations 84, 86, and 88, 90 are performed. First write operation 86 is performed using the write enable mask. Second write operation 86 is performed using the test global write enable, WEi, which is set to the active value of the group write enable. Steps 82–90 are repeated a number times corresponding to the number of bits in the word. Two write operations are required because the data at the outputs is a logic 0 and, therefore, would not perform a write operation.

In the example of FIG. 1, this results in six operations, as indicated by the first six rows of the second phase section of TABLE 1. When these sequences of operations have been completed, as determined at step 92, a final read operation (step 94) and optional write operation (step 96) are performed with the write operation using the global write enable signal.

As mentioned, TABLE 1 provides a step by step description of the fault detection method for testing the bit write enable of three individual bits. The first column shows the operation performed (all read-modify-write), the second and third columns show data input and bit write enable values used during the write operation. The fourth and fifth columns give the memory contents after the operation in good and faulty cases, respectively. The comments column describes the fault detected. While the primary concern of the invention is to test the write enable inputs, the algorithm also tests for data path shorts.

It will be noted that the two phases of the method need not be performed in the order described above. Thus, phase 2 may be performed before phase 1. Further, the two phases need not be performed sequentially—other algorithms may be performed between execution of phases 1 and 2.

As mentioned above, the algorithm phases described may be repeated for more than one memory location in some cases. For example, it is preferred to exercise at least one location in each column of a memory that uses separate write drivers and associated logic for each column. In a memory having multiple memory banks, at least one location of each bank is preferably exercised. When the two latter situations are combined, it is preferred to exercise one location in each column of each bank.

Group Write Enable Testing

Figure 5:
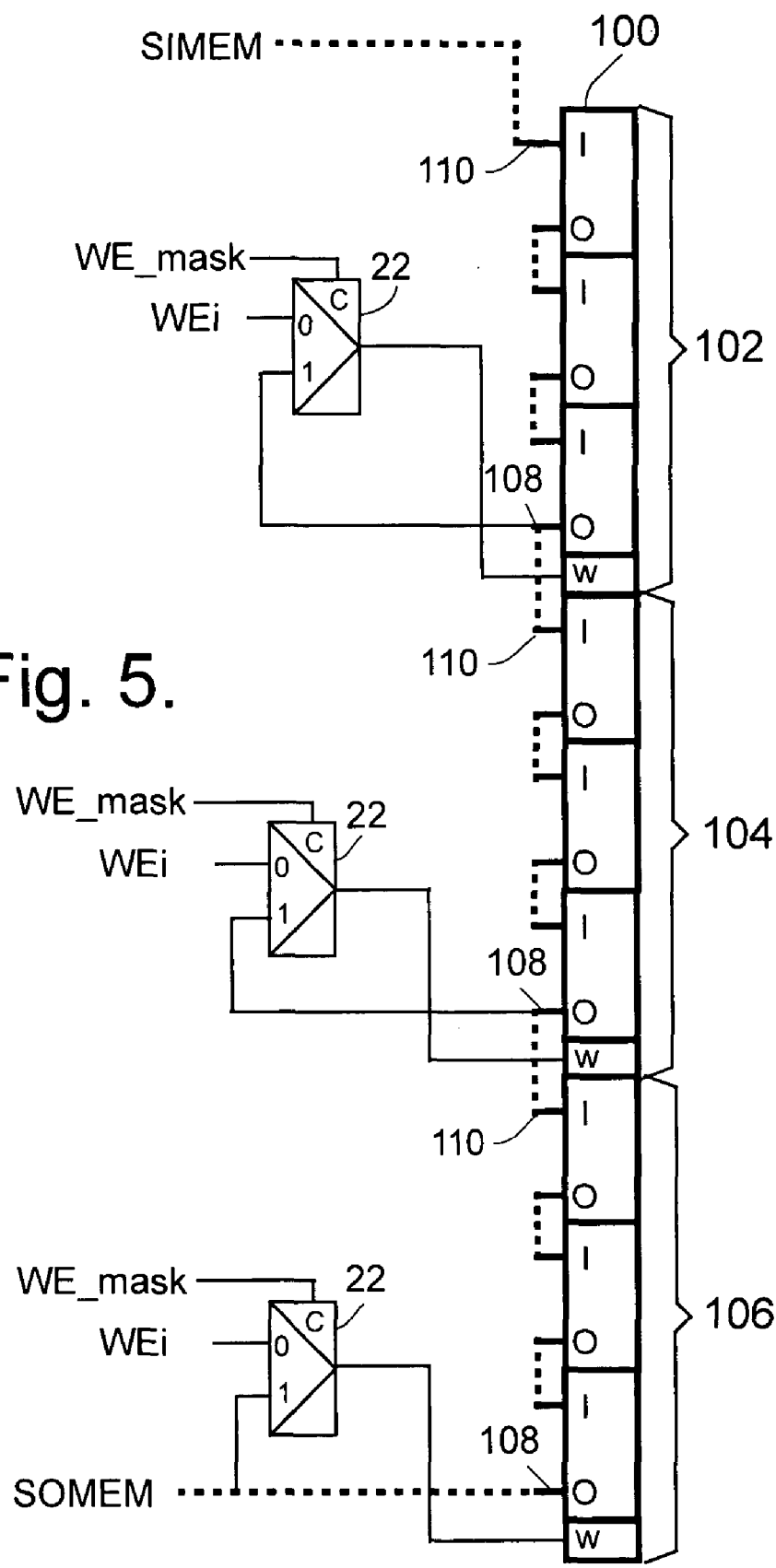
FIG. 5 is a simplified circuit diagram, similar to FIG. 1, but illustrating a memory interface in which data inputs are arranged in groups three with each group being controlled by a respective group write enable input.

The preceding description dealt with an embodiment in which the number of data bits in a group is one. The following description addresses an embodiment in which the number of data bits in a group is greater than one. Specifically, the number is three. FIG. 5 illustrates this embodiment.

FIG. 5 illustrates a memory boundary 100 having three groups 102, 104 and 106 of data input ports, I, output ports, O, and respective group write enable ports W. The input and output ports are shown connected in series in dotted lines with the output port of one bit being connected to the data input port of an adjacent bit and the last data output port 108 in one group being connected to the first input port 110 of the adjacent group. This serial connection mode is achieved by applying an active signal to the control input of selectors 20 in FIG. 1, which are not shown in FIG. 5. The first data input port 110 of first group 102 is connected to the SIMEM output of the test controller. The last data output port 108 of last group 106 is the test serial output which is connected to the SOMEM input of the test controller.

The embodiment of FIG. 5 employs a test circuit which is substantially the same as that of FIG. 1. Multiplexers 14, 16, and 20, memory elements 18 and test controller 24 have not been shown in FIG. 5 in order to simplify the drawing and the description. However, it is to be understood that the test collar is intended to include these components. The figure does show multiplexers 22, each connected to a respective group write enable input, W, of a respective group. The test hardware is modified slightly with respect to the bit write enable embodiment of FIG. 1 to control a group write enable by the most significant output of a group corresponding to the most significant input being controlled.

The method is the same as that described earlier and, therefore, the description of the method need not be repeated. The specific operations are summarized in the TABLE 2. Note that some of the operations are redundant insofar as the detection of write enable faults on write enables; however, the redundant operations can detect data path faults.

Some memories are designed with bidirectional data input and output ports or lines. For such memories, the serial connection is achieved by connecting each line to the input of an associated memory element outside of the memory and to the output of an associated tristate buffer and connecting the output of the memory element to the input of the tristate buffer associated with an adjacent data bit. With reference FIG. 6, the test circuit provides a memory element 120 for each bidirectional input/output port 122 of a memory cell 124. The data input, D, of memory element 120 is connected to bidirectional I/O port 122. The output, Q is connected to bidirectional I/O port 122 of a neighboring memory element via a tristate buffer 126 which is controlled by global enable signal, WEG, applied to the enable input of the buffer. Thus, data latched during a read operation is applied to the I/O port of the neighbor during a write operation. The latched data is also used as the mask during masked write operations.

The above described embodiment was based on active high group write enables. FIG. 7 illustrates an embodiment of a multiplexer circuit 222 which may be used in place multiplexers 22 for handling memory circuits which use active low write enables. Multiplexer circuit 222 is the same as multiplexer 22, except that it includes an inverter 224 for inverting the data output Qi of the memory under test. The contents of the tables corresponding to this embodiment would be the same as TABLES 1 and 2, except for column 3 (bit write enable) and column 6 (comments). In this embodiment, all values of column 3 are inverted. Wired-AND shorts are detected in phase 2 instead of in phase 1 and Wired-OR shorts are detected in phase 1 instead of in phase 2.

The algorithm described thus far covers a bit write enable stuck-at 1 (active) by attempting to write a logic 1 in a cell containing a logic 0 during phase 2. Additional fault coverage might be obtained by using the other data combination, i.e. attempting to write logic 0 in a cell containing a logic 1 using an inactive value of the bit or group write enable. This can be easily accommodated during phase 1. The modified algorithm takes the following form:

$$\text{Phase 1: } ((R1W0)(R1W_m0))^{B*}(R0W0) \quad (3)$$

$$\text{Phase 2: } ((R0W_m1)(R0W1))^{B*}(R1W1) \quad (4)$$

and is illustrated in TABLES 3 and 4 for the bit and group write enables, respectively. The bolded text in the phase 1 notation indicates the modification.

Phase 1 still tests for all possible combinations of wired-AND shorts between write enables (bit and global) and Phase 2 tests for wired-OR shorts. Again, this is assuming an active high (logic 1) bit write enable. The situation is the opposite when an active low (logic 0) bit write enable is employed.

The only change is the addition of R1W0 operations interleaved with the original R1W$_m$0 operations. During these operations, bit write enables are set to their inactive value. As shown in FIG. 8, this is done by connecting test write enable input WE1 of multiplexers 22 to output Phase__2/1 of the test controller 24' which implements the test algorithm. The Phase__2/1 output sends the inactive value of the bit write enable during Phase 1 of the test and the active value during phase 2. Phase 2 is not modified.

The case of group write enables (including byte write enable) is handled using the same algorithm and is illustrated in TABLE 4. The algorithm is used on the same memory as that shown in the description of the original algorithm.

Figure 9:
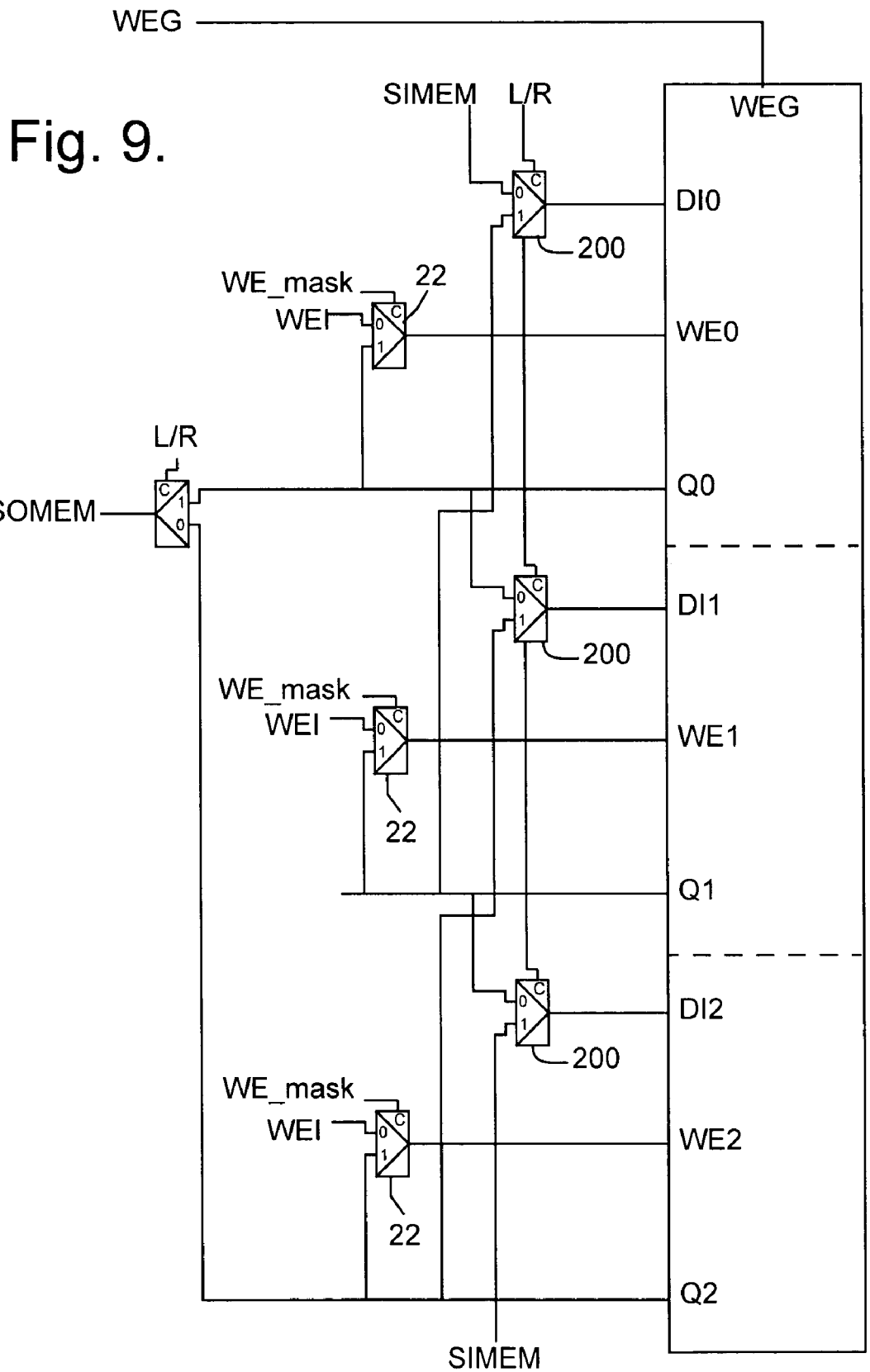
FIG. 9 is a circuit similar to FIG. 1 for use with a method which employs a bidirectional shift to provide extended coverage for a bit write enable, according to an embodiment of present invention.
Figure 10:
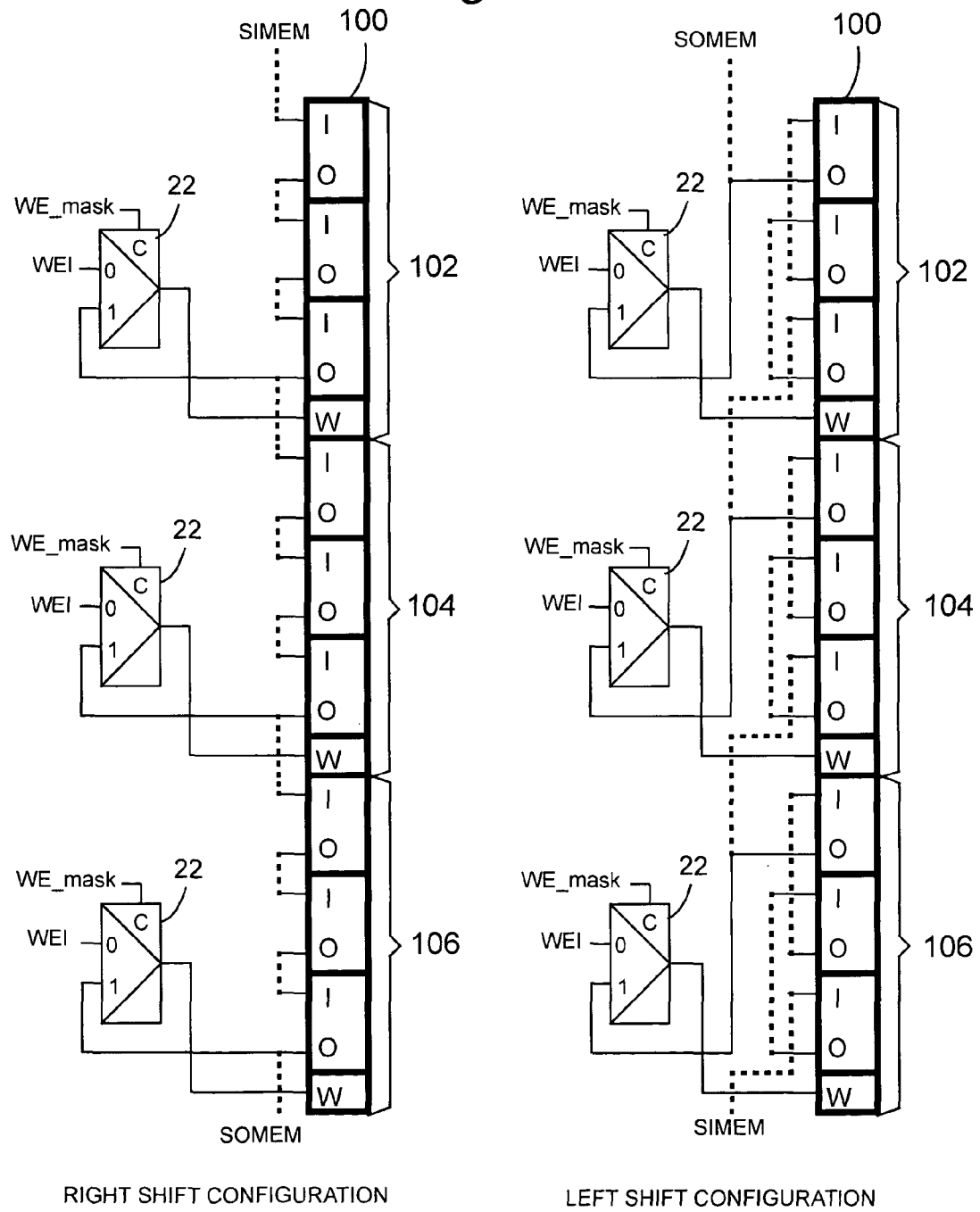
FIG. 10 is a figure similar to FIG. 5 for use with a method which employs a bidirectional shift to provide extended coverage for a group write enable embodiment of present invention, according to an embodiment of present invention.

The algorithm described thusfar does not detect a short (a wired-OR for active high write enable and a wired-AND for active low write enable) between a bit/byte write enable of the most significant bit and the global write enable line, WEG. Further, in some memory implementations, it is possible that branches of the global write enable within a column are driven by more than one buffer. This results in additional bits of a word for which the wired-OR (wired-AND) short to the global write enable are not detected. In order to cover these faults, the algorithm phases described above are repeated but with test data shifted from the most significant bit to the least significant bit instead of the reverse. FIGS. 9 and 10 illustrate means for selectively shifting test data in a left or right (or forward or reverse) direction along the serial path between the test serial input and the test serial output.

FIG. 9 shows a simplified view of the connections to the memory of FIG. 1. This view is obtained by setting the following conditions: S/P (Serial/Parallel)=1, BIST_ON=1 and LV_TM=0, which are in effect when applying the phases of the algorithm of FIG. 9. Multiplexers whose control signal is constant during these phases have been replaced with direct connections and other logic not involved in the test has been deleted from the figure for clarity.

Multiplexers 20 and 14, controlled respectively by S/P and BIST_ON, have been replaced by a direct connection from corresponding multiplexer 200 and memory input DIn. Multiplexers 14, controlled by BIST_ON and whose outputs are connected to bit write enable inputs, have been replaced by a direct connection from corresponding multiplexer 22 to bit write enable input WEn. Multiplexers 16, controlled by LV_TM, have been replaced by a direct connection from corresponding memory output Qn to the input of multiplexer 22. In addition, each memory output is connected to an input of multiplexer 200 of each of its neighbors, when it exists. In this example, only output bit 1 (Q1) has two neighbors. However, in general, all bits have two neighbors except the first and last bit of a word, i.e. the least and most significant bit of the word.

Multiplexers 200 have two inputs and a direction control input L/R (Left/Right). For an inactive value (logic 0) of L/R, test data shifts from left to right, i.e., from bit 0 to bit 2 or from least significant bit to most significant bit, as shown earlier. The serial data input, SIMEM, from the test controller is applied to DI0 and serial data output, SOMEM, returned to the test controller, is Q2.

For an active value of L/R (logic 1), test data shifts from right to left, i.e. from memory bit 2 to bit 0 or from most significant bit to least significant bit. The serial data input (SIMEM) from the test controller is applied to DI2 and the serial data output (SOMEM), returned to the test controller, is Q0. Multiplexer 200 performs the selection between the most and least significant memory output bit to return SOMEM.

FIG. 10 shows the group write enable embodiment when bidirectional shifting is needed to achieve full coverage of shorts. The connections of the memory data inputs and outputs are the same as those of the bit write enable case of FIG. 9. The only additional point to note is that the value used as group write enable test input for a specific group depends on the shift configuration (right or left) instead of always using the most significant data output of the group. In the right shift configuration, the most significant data output of the group is used; in the left shift configuration, the least significant data output of the group is used. A multiplexer (not shown) controlled by the L/R signal can be used to select the appropriate data output.

TABLE 1

Bit Write Enable

| Operation | Data Input | Bit Write Enable | Memory Contents | Faulty Memory Contents | Comments |
|---|---|---|---|---|---|
| *First Phase* | | | | | |
| R1W$_m$0 | 011 | 111 | 011 | — | |
| R1W$_m$0 | 001 | 011 | 001 | 011 | Wired-AND short WE0 to {WEG, WE1} |
| R1W$_m$0 | 000 | 001 | 000 | 001 | Wired-AND short WE1 to {WEG, WE2} Wired-AND short WE2 to {WE0} |
| R0W0 | 000 | 000 | 000 | xx1 | Any of the Wired-AND faults will cause the compare of the MSB to 0 to fail |
| *Second Phase* | | | | | |
| R0W$_m$1 | 100 | 000 | 000 | 100 | Wired-OR short WE0 to {WEG} |
| R0W1 | 100 | 111 | 100 | 110 | propagate fault to serial output |
| R0W$_m$1 | 110 | 100 | 100 | 110 | Wired-OR short WE1 {WEG, WE0} |
| R0W1 | 110 | 111 | 110 | 111 | Propagate faults to serial output |
| R0W$_m$1 | 111 | 110 | 110 | 111 | Wired-OR short WE2 {WEG, WE0, WE1} |
| R0W1 | 111 | 111 | 111 | xx1 | Any of the Wire-OR shorts will cause the compare to 0 to fail at this point |
| R1W1 | 111 | 111 | 111 | — | Optional - Initializes last output to 1. |

TABLE 2

Group Write Enable Testing

| Operation | Data Input | Bit Write Enable | Memory Contents | Faulty Memory Contents | Comments |
|---|---|---|---|---|---|
| *First Phase* | | | | | |
| R1W$_m$0 | 011111111 | 111 | 011111111 | — | |
| R1W$_m$0 | 001111111 | 111 | 001111111 | — | |
| R1W$_m$0 | 000111111 | 111 | 000111111 | — | |
| R1W$_m$0 | 000011111 | 011 | 000011111 | 000111111 | Wired-AND short WE0 to {WEG, WE1} |
| R1W$_m$0 | 000001111 | 011 | 000001111 | 000111111 | |
| R1W$_m$0 | 000000111 | 011 | 000000111 | 000111111 | |
| R1W$_m$0 | 000000011 | 001 | 000000011 | 000000111 | Wired-AND short WE1 to {WEG, WE2} |
| R1W$_m$0 | 000000001 | 001 | 000000001 | 000000111 | |
| R1W$_m$0 | 000000000 | 001 | 000000000 | 000000111 | Wired-AND short WE2 to {WE0} |
| R0W0 | 000000000 | 000 | 000000000 | xxxxxx111 | Any of the Wired-AND faults will cause the compare of the MSB to 0 to fail |
| *Second Phase* | | | | | |
| R0W$_m$1 | 100000000 | 000 | 000000000 | 100000000 | Wired-OR short WE0 to {WEG} |
| R0W1 | 100000000 | 111 | 100000000 | 110000000 | |
| R0W$_m$1 | 110000000 | 000 | 100000000 | 111000000 | |
| R0W1 | 110000000 | 111 | 110000000 | 111100000 | |
| R0W$_m$1 | 111000000 | 000 | 110000000 | 111110000 | |
| R0W1 | 111000000 | 111 | 111000000 | 111111000 | |
| R0W$_m$1 | 111100000 | 100 | 111000000 | 111100000 | Wired-OR short WE1 {WEG, WE0} |
| R0W1 | 111100000 | 111 | 111100000 | 111110000 | |
| R0W$_m$1 | 111110000 | 100 | 111100000 | 111111000 | |
| R0W1 | 111110000 | 111 | 111110000 | 111111100 | |
| R0W$_m$1 | 111111000 | 100 | 111110000 | 111111110 | |
| R0W1 | 111111000 | 111 | 111111000 | 111111111 | |
| R0W$_m$1 | 111111100 | 110 | 111111000 | 111111100 | Wired-OR short WE2 {WEG, WE0, WE1} |
| R0W1 | 111111100 | 111 | 111111100 | 111111110 | |

TABLE 2-continued

Group Write Enable Testing

| Operation | Data Input | Bit Write Enable | Memory Contents | Faulty Memory Contents | Comments |
|---|---|---|---|---|---|
| R0W$_m$1 | 111111110 | 110 | 111111100 | 111111111 | Any of the Wire-OR |
| R0W1 | 111111110 | 111 | 111111110 | 111111111 | shorts will cause the |
| R0W$_m$1 | 111111111 | 110 | 111111110 | 111111111 | compare to 0 to fail at |
| R0W1 | 111111111 | 111 | 111111111 | 111111111 | this point and before in many cases |
| R1W1 | 111 | 111 | 111 | — | Optional - Initializes last output to 1 |

TABLE 3

Bit Write Enable Embodiment

| Operation | Data Input | Bit Write Enable | Memory Contents | Faulty Memory Contents | Comments |
|---|---|---|---|---|---|
| First Phase | | | | | |
| R1W0 | 011 | 000 | 111 | 011 | WE0 SA1 (data 0) |
| R1W$_m$0 | 011 | 111 | 011 | — | |
| R1W0 | 001 | 000 | 011 | 001 | WE1 SA1 (data 0) |
| R1W$_m$0 | 001 | 011 | 001 | 011 | Wired-AND short WE0 to {WEG, WE1} |
| R1W0 | 000 | 000 | 001 | 000 | WE2 SA1 (data 0) |
| R1W$_m$0 | 000 | 001 | 000 | 001 | Wired-AND short WE1 to {WEG, WE2} Wired-AND short WE2 to {WE0} |
| R1W0 | 000 | 000 | 000 | | |
| R0W$_m$0 | 000 | 000 | 000 | xx1 | Any of the Wired-AND faults will cause the compare of the MSB to 0 to fail |
| Second Phase | | | | | |
| R0W$_m$1 | 100 | 000 | 000 | 100 | Wired-OR short WE0 to {WEG} or WE0 SA1 (data 1) |
| R0W1 | 100 | 111 | 100 | 110 | propagate fault to serial output |
| R0W$_m$1 | 110 | 100 | 100 | 110 | Wired-OR short WE1 {WEG, WE0} or WE1 SA1 (data 1) |
| R0W1 | 110 | 111 | 110 | 111 | propagate faults to serial output |
| R0W$_m$1 | 111 | 110 | 110 | 111 | Wired-OR short WE2 {WEG, WE0, WE1} or WE2 SA1 (data 1) |
| R0W1 | 111 | 111 | 111 | xx1 | Any of the Wire-OR shorts will cause the compare to 0 to fail at this point |
| R1W1 | 111 | 111 | 111 | — | last operation only initializes last output to 1 (could be removed) |

TABLE 4

Group Write Enable Testing

| Operation | Data Input | Bit Write Enable | Memory Contents | Faulty Memory Contents | Comments |
|---|---|---|---|---|---|
| First Phase | | | | | |
| R1W$_m$0 | 011111111 | 000 | 111111111 | 011111111 | Wired-AND short WE0 to {WEG} |
| R1W$_m$0 | 011111111 | 111 | 011111111 | 001111111 | |
| R1W0 | 001111111 | 000 | 011111111 | 000111111 | |
| R1W$_m$0 | 001111111 | 111 | 001111111 | 000011111 | |
| R1W0 | 000111111 | 000 | 001111111 | 000001111 | |
| R1W$_m$0 | 000111111 | 111 | 000111111 | 000000111 | |
| R1W0 | 000011111 | 000 | 000111111 | 000011111 | Wired-AND short WE1 to {WEG} |
| R1W$_m$0 | 000011111 | 011 | 000011111 | 000001111 | |
| R1W0 | 000001111 | 000 | 000011111 | 000000111 | |
| R1W$_m$0 | 000001111 | 011 | 000001111 | 000000011 | |
| R1W0 | 000000111 | 000 | 000001111 | 000000001 | |

TABLE 4-continued

Group Write Enable Testing

| Operation | Data Input | Bit Write Enable | Memory Contents | Faulty Memory Contents | Comments |
|---|---|---|---|---|---|
| R1W$_m$0 | 000000111 | 011 | 000000111 | 000000000 | |
| R1W0 | 000000011 | 000 | 000000111 | 000000011 | Wired-AND short WE2 |
| R1W$_m$0 | 000000011 | 001 | 000000011 | 000000001 | to {WEG} |
| R1W0 | 000000001 | 000 | 000000011 | 000000000 | |
| R1W$_m$0 | 000000001 | 001 | 000000001 | 000000000 | |
| R1W0 | 000000000 | 000 | 000000001 | 000000000 | |
| R1W$_m$0 | 000000000 | 001 | 000000000 | 000000000 | |
| R0W0 | 000000000 | 000 | 000000000 | xxxxxx111 | Any of the Wired-AND faults will cause the compare of the MSB to 0 to fail |
| Second Phase | | | | | |
| R0W$_m$1 | 100000000 | 000 | 000000000 | 100000000 | Wired-OR short WE0 |
| R0W1 | 100000000 | 111 | 100000000 | 110000000 | to {WEG} |
| R0W$_m$1 | 110000000 | 000 | 100000000 | 111000000 | |
| R0W1 | 110000000 | 111 | 110000000 | 111100000 | |
| R0W$_m$1 | 111000000 | 000 | 110000000 | 111110000 | |
| R0W1 | 111000000 | 111 | 111000000 | 111111000 | |
| R0W$_m$1 | 111100000 | 100 | 111000000 | 111100000 | Wired-OR short WE1 |
| R0W1 | 111100000 | 111 | 111100000 | 111110000 | {WEG, WE0} |
| R0W$_m$1 | 111110000 | 100 | 111100000 | 111111000 | |
| R0W1 | 111110000 | 111 | 111110000 | 111111100 | |
| R0W$_m$1 | 111111000 | 100 | 111110000 | 111111110 | |
| R0W1 | 111111000 | 111 | 111111000 | 111111111 | |
| R0W$_m$1 | 111111100 | 110 | 111111000 | 111111100 | Wired-OR short WE2 |
| R0W1 | 111111100 | 111 | 111111100 | 111111110 | {WEG, WE0, WE1} |
| R0W$_m$1 | 111111110 | 110 | 111111100 | 111111111 | Any of the Wire-OR |
| R0W1 | 111111110 | 111 | 111111110 | 111111111 | shorts will cause the |
| R0W$_m$1 | 111111111 | 110 | 111111110 | 111111111 | compare to 0 to fail at this point and before in many cases |
| R1W1 | 111 | 111 | 111 | — | last operation only |

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method of testing write enable lines of random access memory having at least one word having one or more write enable inputs for controlling write operations in said word, said method comprising, for a selected memory address:
    shifting a series of test bits through an addressed word via a first data input to said word;
    for each test bit, performing a write operation to said word using a write enable test input derived from data outputs of said word or from a test write enable signal applied concurrently to each write enable input; and
    after each write operation, comparing a last bit of the word against an expected value to determine whether there exists a defect in a write enable line.

2. A method as defined in claim 1, wherein said shifting a series of test bits including applying said test bits to a least significant bit of said word and said last bit of the word is a most significant bit of the word.

3. A method as defined in claim 1, wherein said shifting a series of test bits including applying said test bits to a most significant bit of said word and said last bit of the word is a least significant bit of the word.

4. A method of testing group write enable lines of random access memory having a global write enable input for controlling write operations in said memory, at least one word arranged in one or more groups of memory cells, and having data inputs, data outputs and group write enable inputs for controlling group write operations in said groups, said method comprising, for a selected memory address:
    initializing a word under test to a predetermined value of said group write enables;
    serially connecting said data inputs and data outputs between a test serial input connected to the data input of a first memory cell of said word and a test serial output connected to a data output of a last memory cell of said word;
    shifting a series of test bits which are opposite said predetermined value through an addressed word by a series of read and write operations, with each write operation being performed using, for each group, a group write enable test input selected from either a group write enable mask derived from a last data output of the group or from a test group write enable signal; and
    performing a final read operation of said word.

5. A method as defined in claim 4, each said read operation of said series of read and write operations including reading said word and comparing the last bit thereof to a first expected value and said final read operation including reading said word and comparing the last bit thereof to a second expected value opposite said first expected value.

6. A method as defined in claim 5, said shifting test bits comprising shifting said test bits in a first direction through said addressed word, said method further including repeating said method but shifting said test bits in a second direction, opposite said first direction, through said addressed word.

7. A method as defined in claim 5, further including, when said predetermined value is an active value of said group write enables, each said read and write operations of said series of read and write operations comprises a sequence of a read operation and a write operation using said write enable mask.

8. A method as defined in claim 5, further including, when said predetermined value is an inactive value of said group write enables, each said read and write operations of said series of read and write operations including:
a first sequence of a read operation and a write operation using said write enable mask; and
a second sequence of a read operation and a write operation using an active group write enable signal.

9. A method as defined in claim 5, wherein said predetermined value is an active value of said group write enables, said test bits are inactive values of said group write enables, said first expected value is said active value of said group write enables and said second expected value is an inactive value of said group write enables.

10. A method as defined in claim 9, each said read and write operations of said series of read and write operations including:
a first sequence of a read and write operation including a read operation followed by a write operation using an inactive test group write enable signal; and
a second sequence of a read and write operation including a read operation followed by a write operation using said write enable mask.

11. A method as defined in claim 9, further including repeating said method using a predetermined value which is an inactive value of said group write enables, test bits which are active values of said group write enables, a first expected value which is said inactive value of said group write enables and a second expected value is an active value of said group write enables.

12. A method as defined in claim 10, further including repeating said method using a predetermined value which is an inactive value of said group write enables, test bits which are active values of said group write enables, a first expected value which is said inactive value of said group write enables and a second expected value is an active value of said group write enables.

13. A method as defined in claim 11, said serially connecting including connecting the data memory cells of the word in increasing significance order in which the data input of a first data memory cell of said word is connected to said test serial input, the data output of each data memory cell is connected to the data input of an adjacent most significant data memory cell, and the data output of a last data memory cell of said word is connected to said test serial output; and
said shifting test bits comprising shifting test values between said test serial input and said test serial output.

14. A method as defined in claim 11, said serially connecting including connecting the data memory cells of the word in decreasing significance order in which the data input of a last data memory cell of said word is connected to said test serial input, the data output of each data memory cell is connected to the data input of an adjacent least significant data memory cell, and the data output of a first data memory cell of said word is connected to said test serial output; and
said shifting test bits comprising shifting test values between said test serial input and said test serial output.

15. A method as defined in claim 5, wherein said predetermined value is an inactive value of said group write enables, said test bits are active values of said group write enables, said first expected value is said inactive value of said group write enables and said second expected value is an active value of said group write enables.

16. A method as defined in claim 5, further including, after said final read operation, applying the opposite of said predetermined value to said test serial input and performing write operation using said active group write enable signal applied to each group write enable input and said global write enable input.

17. A method as defined in claim 4, further including, performing said method at each of two or more selected addresses of a memory under test.

18. A method as defined in claim 17, further including, performing said method at least one address in each column of a memory having separate write drivers and associated logic for each column.

19. A method as defined in claim 17, further including, performing said method at at-least one address of each bank of a memory having multiples banks.

20. A method as defined in claim 17, further including, for a memory having multiple banks and columns having separate write drivers and associated logic for each column, performing said method at at-least one address in each column of each bank.

21. A method as defined in claim 4, said serially connecting said data inputs and data outputs comprises serially connecting from a least significant data memory cell of each group to a most significant data memory cell of each group and connecting the most significant output of each group to the group write enable input.

22. A method as defined in claim 4, said serially connecting said data inputs and data outputs comprises serially connecting from a most significant data memory cell of each group to a least significant data memory cell of each group and connecting the least significant output of each group to the group write enable input.

23. A method as defined in claim 4, wherein the number of said test bits corresponds to the number of data memory cells in a word under test.

24. A method as defined in claim 4, further including:
latching each data output of said memory during a read operation and applying latched data to an associated data input during write operations and using said latched data of a last data output as a group write enable mask data.

25. A method as defined in claim 4, further including, for a memory having bidirectional input and output lines, said serially connecting comprising connecting each said line to the input of an associated memory element outside of said memory and to the output of an associated tristate buffer and connecting the output of said memory element to the input of the tristate buffer associated with an adjacent data memory cell.

26. A method of testing group write enable lines of random access memory having a global write enable input for controlling write operations in said memory, at least one word arranged in one or more groups of memory cells, and having data inputs, data outputs and group write enable inputs for controlling group write operations in said groups, said method comprising, for a selected memory address:
serially connecting said data inputs and data outputs of a word under test between a test serial input connected to a first memory cell of said word and a test serial output connected to a last memory cell of said word;

performing a first group write enable test phase, including:

initializing a word under test to a predetermined value of said group write enables;

shifting a first series of test bits which are opposite said predetermined value through said word by a series of read and write operations, with each write operation being performed using, for each group, a group write enable test input selected from either a group write enable mask derived from a last data output of the group or from an active group write enable signal; and performing a first final read operation of said word;

performing a second group write enable test phase, including:

shifting a second series of test bits which are the same as said predetermined value through said word by a series of read and write operations, with each write operation being performed using, for each group, a group write enable test input selected from either a group write enable mask derived from a last data output of the group or from an active group write enable signal; and performing a second final read operation of said word.

27. A method as defined in claim 26, further including, repeating said method but shifting said test bits in an opposite direction through a word under test.

28. A method as defined in claim 27, further including, performing said method at each of two or more selected addresses of a memory under test.

29. A method as defined in claim 28, further including, performing said method at at-least one address in each column of a memory having separate write drivers and associated logic for each column.

30. A method as defined in claim 28, further including, performing said method at at-least one address of each bank of a memory having multiples banks.

31. A method as defined in claim 28, further including, for a memory having multiple banks and columns having separate write drivers and associated logic for each column, performing said method at at-least one address in each column of each bank.

32. A method as defined in claim 26, each said read operation of said series of read and write operations comprising reading said word and comparing a last memory cell thereof to a first expected value and said final read operation comprising reading said word and comparing the last memory cell thereof to a second expected value opposite said first expected value.

33. A method as defined in claim 26, wherein said shifting comprises applying test bits to a least significant data input of said word and said read operations comprise reading a most significant memory cell of said word and comparing said most significant memory cell to an expected value.

34. A method as defined in claim 26, wherein said shifting comprises applying test bits to a most significant input of said word and said read operations comprise reading a least significant memory cell of said word and comparing said least significant memory cell to an expected value.

35. A test circuit for testing group write enable lines of random access memory (RAM) having at least one word arranged in one or more groups of data memory cells, a global write enable input, data inputs, data outputs, and group write enable inputs for controlling write operations to said groups of data memory cells, comprising:

means for selectively connecting said data inputs and data outputs in series or in parallel, and, when connected in series, said data inputs and outputs defining a serial path between a test serial input connected to a first of said data inputs and a test serial output connected to a last of said data outputs; and means associated with each said group write enable input for selectively connecting either a data output of said group or a test group write enable signal to said group write enable input.

36. A test circuit as defined in claim 35, said means associated with each said group write enable input comprising a group write enable multiplexer circuit having:

a first input connected to the last output of a corresponding group;

a second input for receiving an test group write enable signal;

a control input for receiving a write enable mask control signal; and an output connected to said group write enable input.

37. A test circuit as defined in claim 36, said means for selectively connecting said data inputs and data outputs in series comprising a data input multiplexer circuit for each data input, said data input multiplexer circuit having:

a first input for receiving a data output of an adjacent data memory cell;

a second input for receiving a test data input;

an output connected to said data input; and a control input for selecting between said first and second inputs.

38. A test circuit as defined in claim 35, said means for selectively connecting said data inputs and data outputs in series comprising a data input multiplexer circuit for each data input, each said data input multiplexer circuit having:

a first input for receiving a data output of an adjacent data memory cell of a word under test;

a second input for receiving a test data input;

an output connected to said data input; and a control input for selecting between said first and second inputs.

39. A test circuit as defined in claim 35, further including, for each data output, a memory element outside of said memory for latching data output from said data output and for loading latched data outputs into a respective data input.

40. A test circuit as defined in claim 35, further including, for a memory having bidirectional data input and output lines, each said lines having:

an associated memory element for latching an output applied along said line, said memory element having a data input connected to said line and an output;

a tristate buffer controlled by said global write enable and having an output connected to said line and an input connected to an output of the memory element associated with an adjacent data bit memory element; and said output of said memory element being connected to the input of a tristate buffer associated with an adjacent data bit.

41. A test circuit as defined in claim 36, further including, for a memory which uses an active low write enable value, inverter means having an output connected to said first input and an inverter input connected to the last output of a corresponding group.

42. A test circuit as defined in claim 35, said means for selectively connecting said data inputs and data outputs in series further including means for selectively connecting either a least significant memory cell or a most significant memory cell of a word to said test serial input and for connecting either a most significant memory cell or a least significant memory cell of said word to said test serial output for selectively shifting test data in a forward or reverse direction along said serial path between said test serial input and said test serial output.

43. A test circuit as defined in claim 42, said means for selectively connecting further including:

a data input multiplexer circuit for each said data input, each said data input multiplexer having an output connected to an associated data input, a first input connected to the data output of a first adjacent data bit or, if said multiplexer is associated with a first data input along said serial path, to said test serial input, a second input connected to the data output of a second adjacent data bit, and a control input for a shift direction control signal for selecting a shift direction; and a serial output multiplexer circuit having an output connected to said test serial output, a first input connected to a first data output along said serial path, a second input connected a last data output of said serial path, and a control input for receiving said shift direction control signal.

44. A test circuit as defined in claim 35, further including:

a test controller for testing said group write enable inputs, said test controller having a write enable mask control output; a test serial output; a serial control output for controlling said means for selectively connecting said data inputs and outputs in series or in parallel; a test group write enable output connected to said means associated with each said group write enable input; and a finite state machine for performing a write enable test of a memory, including initializing a word under test to a predetermined value of group write enables; serially connecting said data inputs and data outputs between said test serial input and said test serial output; shifting a series of test bits which are opposite said predetermined value through an addressed word by a series of read and write operations, with each write operation being performed using, for each group, a group write enable test input selected from either a group write enable mask derived from a last data output of the group or from a test group write enable signal; and performing a final read operation.

45. A test circuit as defined in claim 44, further including means for latching each data output outside of said memory and for loading said latched data outputs into respective data inputs.

46. A test circuit as defined in claim 44, said memory including an input data bus and an output data bus, said input data bus and said output data bus being the same bus, said test circuit further including latching each said data output outside the memory.

47. A test circuit as defined in claim 44, further including, a multiplexer circuit for use with a memory circuit which uses an active low group write enable:

a multiplexer having a control input for receiving a write enable mask signal, a first input for receiving said test group write enable signal, a second input for receiving the data output of an adjacent data bit, and an inverter for inverting said data output and applying an inverted data output to said second input of said multiplexer.

48. A circuit as defined in claim 44, said means for selectively connecting said data inputs and data outputs in series further including means for selectively connecting either a least significant memory cell or a most significant memory cell of a word to said test serial input and for connecting either a most significant memory cell or a least significant memory cell of said word to said test serial output for selectively shifting test data in a forward or reverse direction along said serial path between said test serial input and said test serial output.

49. A circuit as defined in claim 48, said means for selectively connecting further including:

a data input multiplexer circuit for each said data input, each said data input multiplexer having an output connected to an associated data input, a first input connected to the data output of a first adjacent data bit or, if said multiplexer is associated with a first data input along said serial path, to said test serial input, a second input connected the data output of a second adjacent data bit, and a control input for a shift direction control signal for selecting a shift direction; and a serial output multiplexer circuit having an output connected to said test serial output, a first input connected to a first data output along said serial path, a second input connected a last data output of said serial path, and a control input for receiving said shift direction control signal.

* * * * *